United States Patent
Posner et al.

(10) Patent No.: US 10,120,411 B2
(45) Date of Patent: Nov. 6, 2018

(54) SYSTEMS WITH LOW-FRICTION MATTE FLEXIBLE PRINTED CIRCUITS

(71) Applicant: Apple Inc., Cupertino, CA (US)

(72) Inventors: Bryan W. Posner, San Francisco, CA (US); Adam T. Garelli, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/243,370

(22) Filed: Aug. 22, 2016

(65) Prior Publication Data

US 2018/0052488 A1 Feb. 22, 2018

(51) Int. Cl.
H05K 1/02 (2006.01)
G06F 1/16 (2006.01)
H05K 3/28 (2006.01)

(52) U.S. Cl.
CPC .......... G06F 1/1616 (2013.01); G06F 1/1681 (2013.01); G06F 1/1683 (2013.01); H05K 1/0281 (2013.01); H05K 3/285 (2013.01); H05K 2201/015 (2013.01); H05K 2203/1173 (2013.01)

(58) Field of Classification Search
CPC .... G06F 1/1616; G06F 1/1681; G06F 1/1683; H05K 1/036; H05K 1/0393; H05K 1/148; H05K 2203/1173; H05K 2201/015
See application file for complete search history.

(56) References Cited

U.S. PATENT DOCUMENTS

| | | |
|---|---|---|
| 9,450,289 B2 | 9/2016 | Guternam et al. |
| 2005/0163968 A1 | 7/2005 | Hanket |
| 2006/0007059 A1 | 1/2006 | Bell |
| 2007/0040258 A1 | 2/2007 | Sheats |
| 2007/0098910 A1 | 5/2007 | Yamagata et al. |
| 2007/0148416 A1* | 6/2007 | Wolkin ............... G01K 17/006 428/195.1 |
| 2008/0077050 A1* | 3/2008 | Von Malmborg ... A61B 5/6851 600/585 |
| 2008/0185173 A1* | 8/2008 | Bedinger ............ H01L 23/3192 174/258 |
| 2011/0070493 A1* | 3/2011 | Gadkaree ............... H01G 11/68 429/220 |

(Continued)

FOREIGN PATENT DOCUMENTS

JP 2008251877 10/2008

*Primary Examiner* — Hoa C Nguyen
(74) *Attorney, Agent, or Firm* — Treyz Law Group, P.C.; G. Victor Treyz; David K. Cole

(57) ABSTRACT

An electronic device may include flexible printed circuits. A flexible printed circuit may have metal traces supported by a polymer substrate. The flexible printed circuit may extend between an upper laptop computer housing and a lower laptop computer housing or other structures that move relative to each other in an electronic device. The flexible printed circuit may have a low-friction coating and a matte finish. The flexible printed circuit may have a fluoropolymer coating on the polymer substrate, a fluoropolymer coating on a matte coating on the polymer substrate, a fluoropolymer coating that includes a matting agent on the polymer substrate, a fluoropolymer layer or other polymer layer that is attached to the substrate with a layer of adhesive, a textured surface layer, and/or other structures that help provide the flexible printed circuit with desired physical properties and a desired appearance.

18 Claims, 7 Drawing Sheets

(56) References Cited

U.S. PATENT DOCUMENTS

| | | | |
|---|---|---|---|
| 2012/0051007 A1* | 3/2012 | Alvarez | H05K 5/0213 |
| | | | 361/752 |
| 2012/0094012 A1* | 4/2012 | Yokoyama | C09D 7/005 |
| | | | 427/8 |
| 2012/0112347 A1* | 5/2012 | Eckhardt | H01L 21/6835 |
| | | | 257/751 |
| 2013/0162656 A1* | 6/2013 | Holman | G02F 1/19 |
| | | | 345/501 |
| 2013/0335805 A1* | 12/2013 | Dean | G02B 26/005 |
| | | | 359/290 |
| 2015/0003061 A1* | 1/2015 | Brukilacchio | G01N 21/8806 |
| | | | 362/237 |
| 2015/0185788 A1* | 7/2015 | Matsuoka | B21D 53/40 |
| | | | 361/679.02 |
| 2015/0195921 A1 | 7/2015 | Onodera et al. | |

* cited by examiner

SYSTEMS WITH LOW-FRICTION MATTE FLEXIBLE PRINTED CIRCUITS

FIELD

This relates generally to electronic devices and, more particularly, to flexible printed circuit structures coupled between components in electronic devices.

BACKGROUND

Electronic devices often include displays and other components. These components may sometimes be mounted in folding lids or other movable housings structures. A flexible printed circuit cable may be used to couple components together. For example, a flexible printed circuit cable may be used to couple a display in a laptop computer lid to a logic board in the main housing of the laptop computer.

If care is not taken, flexible printed circuits can be insufficiently robust to withstand repeated movement within a housing that has a movable lid or other movable structures, may be unsightly, or may be vulnerable to moisture exposure.

SUMMARY

An electronic device may include flexible printed circuits. A flexible printed circuit may have metal traces supported by a polymer substrate. The flexible printed circuit may traverse a gap between an upper laptop computer housing and a lower laptop computer housing or other structures that move relative to each other or may be used elsewhere in an electronic device.

The flexible printed circuit may have a low-friction coating that helps prevent sticking of the flexible printed circuit to structures in an electronic device such as movable housing structures. The low-friction coating may enhance moisture repellency (hydrophobicity). The flexible printed circuit may also have a matte finish such as a black matte finish to enhance the appearance of the flexible printed circuit.

The flexible printed circuit may have a fluoropolymer coating on a polymer substrate, a fluoropolymer coating on a matte coating on a polymer substrate, a polymer substrate with a fluoropolymer coating that includes a matting agent, a fluoropolymer layer or other polymer layer that is attached to a polymer substrate with a layer of adhesive, a textured surface layer, and other structures that help provide the flexible printed circuit with desired physical properties and a desired appearance.

DETAILED DESCRIPTION

Figure 1:
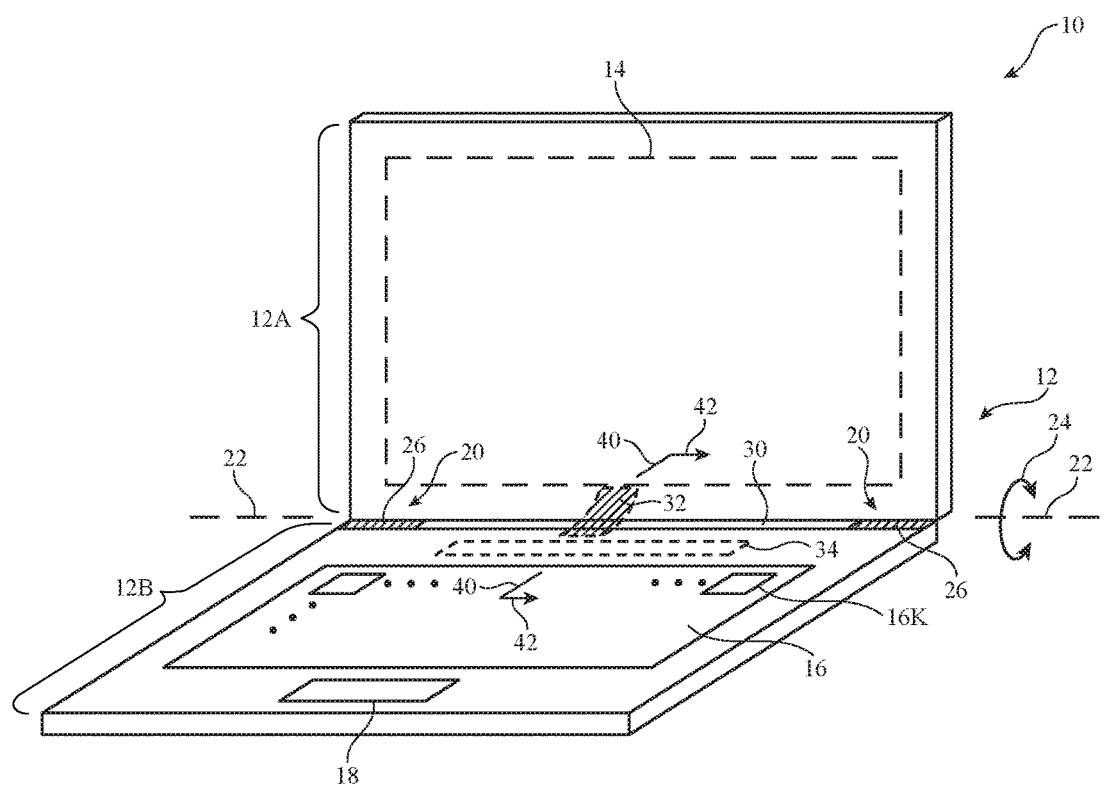
FIG. 1 is a perspective view of an illustrative electronic device such as a laptop computer in accordance with an embodiment.

Flexible printed circuits may be used to couple together circuitry in electronic devices and may be used as substrates to which integrated circuits and other components may be mounted. An electronic device of the type that may include one or more flexible printed circuits is shown in FIG. 1. Device 10 of FIG. 1 may be a handheld electronic device such as a cellular telephone, media player, gaming device, or other device, may be a laptop computer, tablet computer, or other portable computer, may be a desktop computer, may be a computer display, may be a display containing an embedded computer, may be a television or set top box, or may be other electronic equipment. Configurations in which device 10 is a device such as a portable computer that has a lid that rotates relative to a base may sometimes be described herein as examples. This is, however, merely illustrative. Device 10 may be any suitable electronic equipment.

As shown in the example of FIG. 1, device 10 may have a housing such as housing 12. Housing 12 may be formed from plastic, metal (e.g., aluminum), fiber composites such as carbon fiber, glass, ceramic, other materials, and combinations of these materials. Housing 12 or parts of housing 12 may be formed using a unibody construction in which housing structures are formed from an integrated piece of material. Multipart housing constructions may also be used in which housing 12 or parts of housing 12 are formed from frame structures, housing walls, and other components that are attached to each other using fasteners, adhesive, and other attachment mechanisms.

As shown in FIG. 1, device 10 may have input-output devices such as track pad 18 and keyboard 16. Track pad 18 may be formed from a touch sensor that gathers touch input from a user's fingers. Keyboard 16 may have an array of keys 16K that protrude through openings in the upper wall of housing 12B. Device 10 may also have components such as a camera, microphones, speakers, buttons, status indicator lights, sensors, and other input-output devices. These devices may be used to gather input for device 10 and may be used to supply a user of device 10 with output. Ports in device 10 may receive mating connectors (e.g., an audio plug, a connector associated with a data cable such as a Universal Serial Bus cable, a data cable that handles video and audio data such as a cable that connects device 10 to a computer display, television, or other monitor, etc.).

Device 10 may include a display such a display 14. Display 14 may be a liquid crystal display (LCD), a plasma display, an organic light-emitting diode (OLED) display, an electrophoretic display, or a display implemented using other display technologies. A touch sensor may be incorporated into display 14 (i.e., display 14 may be a touch screen display) or display 14 may be insensitive to touch. Touch sensors for display 14 may be resistive touch sensors, capacitive touch sensors, acoustic touch sensors, light-based touch sensors, force sensors, or touch sensors implemented using other touch technologies.

Device 10 may have a one-piece housing or a multi-piece housing. As shown in FIG. 1, for example, electronic device 10 may be a device such as a portable computer or other device that has a two-part housing formed from an upper housing portion such as upper housing 12A and lower housing portion such as lower housing 12B. Upper housing 12A may include display 14 and may sometimes be referred to as a display housing or lid. Lower housing 12B may sometimes be referred to as a base housing or main housing.

Housings 12A and 12B may be connected to each other using hinge structures located in region 20 along the upper edge of lower housing 12B and the lower edge of upper housing 12A. For example, housings 12A and 12B may be coupled using hinges 26. Hinges 26 may be located at opposing left and right edges of housing 12 along hinge axis 22. A slot-shaped opening such as opening (slot) 30 may be formed between upper housing 12A and lower housing 12B and may be bordered on either end by hinges 26. Hinges 26 may allow upper housing 12A to rotate about axis 22 in directions 24 relative to lower housing 12B. The plane of lid (upper housing) 12A and the plane of lower housing 12B may be separated by an angle that varies between 0° when the lid is closed to 90°, 140°, or more when the lid is fully opened.

Devices such as device 10 of FIG. 1 may include printed circuits. The printed circuits may contain signal paths formed from metal traces (e.g., traces of copper, gold, other metals, etc.) and insulating substrate layers. The printed circuits may include rigid printed circuit boards (e.g., printed circuits formed from fiberglass-filled epoxy or other rigid printed circuit board substrate material) and flexible printed circuits (e.g., printed circuits formed from flexible sheets of polymer such as layers of polyimide or other flexible polymer substrate material). Integrated circuits, connectors, discrete components (e.g., inductors, capacitors, and resistors), and other electrical components may be coupled to printed circuits such as flexible printed circuits (e.g., using conductive connections formed from solder, conductive adhesive, or other conductive material). Flexible printed circuits may also be used as signal paths for routing signals between different locations in an electronic device. For example, a flexible printed circuit such as flexible printed circuit 32 of FIG. 1 may be used to route signals between display 14 and circuitry 34 across gap 30. Circuitry 34 may include integrated circuits and/or other circuit components mounted to a logic board to which printed circuit 32 is coupled or integrated circuits and/or other circuit components mounted on an end portion of printed circuit 32 (e.g., circuitry 34 may include storage and processing circuitry such as a microprocessor, a graphics processing unit, and/or other circuitry for supporting the operation of device 10). Flexible printed circuit cables may be used to couple logic boards and other circuits to components such as touch sensors, may be used in interconnecting logic boards, may be used in routing signals between a logic board and a camera module or other components in device 10, and/or may be used to convey signals between other circuitry in device 10.

Figure 2:
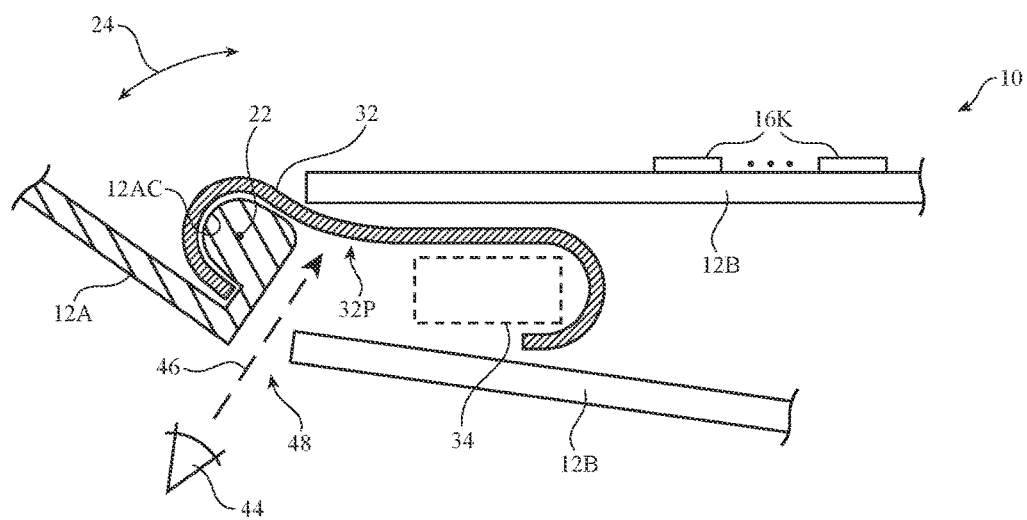
FIG. 2 is a cross-sectional side view of an illustrative electronic device such as a laptop computer with a flexible printed circuit in accordance with an embodiment.

In some arrangements, printed circuits may be visible to a user of an electronic device and/or may experience repeated bending and unbending stress. Consider, as an example, the arrangement of FIG. 1 in which flexible printed circuit 32 extends between upper housing 12A and lower housing 12B. A cross-sectional side view of a portion of device 10 of FIG. 1 taken along line 40 and viewed in direction 42 is shown in FIG. 2. As shown in the illustrative cross-sectional side view of device 10 of FIG. 2, a viewer such as user 44 may view portion 32P of flexible printed circuit 32 through housing openings such as gap 48 in direction 46 when upper housing 12A is in an open position relative to lower housing 12B (as an example). During use of device 10, a user may open and close device 10 repeatedly. As upper housing 12A is opened and closed (e.g., by rotating housing 12A relative to housing 12B in directions 24 relative to axis 22), flexible printed circuit 32 may be repeatedly bent back and forth. In an open configuration such as the illustrative configuration of FIG. 2, the surface of flexible printed circuit 32 that faces curved surface 12AC of housing 12A may be stretched against curved surface 12AC. As a result, there is a risk that flexible printed circuit 32 will stick to surface 12AC.

As a result of these concerns, it may be desirable to provide flexible printed circuit 32 with a number of enhanced visual and mechanical attributes. For example, it may be desirable to provide flexible printed circuit 32 with a matte appearance (e.g., a dark low gloss appearance) so that portion 32P of flexible printed circuit is visually attractive (e.g., not too bright and shiny). To sustain repeated bending as housing 12 is opened and closed, it may be desirable to form flexible printed circuit 32 from structures that are sufficiently robust to withstand repeated flexing and possible punctures from external objects that protruded through openings such as opening 48. To ensure that flexible printed circuit 32 does not stick to a surface such as surface 12AC, it may be desirable to provide flexible printed circuit 32 with a low-friction surface that exhibits low adhesion to surface 12AC. A surface such as a low-adhesion surface may be moisture repellant (e.g., flexible printed circuit 32 may be hydrophobic) and may therefore sometimes be referred to as a nonstick or hydrophobic surface.

Figure 3:
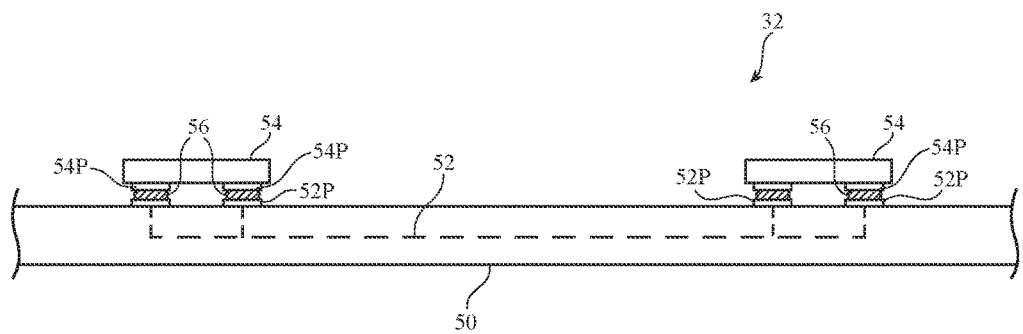
FIG. 3 is a cross-sectional side view of an illustrative flexible printed circuit in accordance with an embodiment.

A cross-sectional side view of an illustrative printed circuit of the type that may be provided with attributes such as these is shown in FIG. 3. A printed circuit for device 10 such as printed circuit 32 of FIG. 3 may be a rigid printed circuit board, may be a rigid flex circuit that contains both rigid printed circuit board portions and flexible printed circuit portions, or may be a flexible printed circuit that does not include any rigid printed circuit board portions. Illustrative configurations in which printed circuit 32 is a flexible printed circuit without rigid portions may sometimes be described herein as an example.

As shown in FIG. 3, flexible printed circuit 32 may have a substrate such as substrate 50. Substrate 50 may include one or more layers of polyimide or other flexible sheets of polymer material. These sheets of material may be laminated together using interposed layers of adhesive (as an example). Patterned metal traces 52 (e.g., lines, vias, and contact pads formed from copper and/or other metals) may be used to carry signals in flexible printed circuit 32. For example, flexible printed circuit 32 may include metal traces such as solder pads 52P to which connectors, integrated circuits, and other components 54 may be soldered (e.g., using mating solder pads 54P on components 54 and solder 56). Conductive connections to traces 52 in flexible printed circuit 32 may also be made using conductive adhesive and/or other electrical coupling mechanisms.

There may be any suitable number of components 54 coupled to flexible printed circuit 32. For example, flexible printed circuit 32 may be used solely as a signal bus cable and may have connectors mounted at each end and no intervening circuit components soldered to traces 52 along the length of flexible printed circuit 32. As another example, flexible printed circuit 32 may be populated with 2-10, more than 3, fewer than 20 or other suitable number of electrical components (connectors, integrated circuits, discrete components, etc.). In some configurations, flexible printed circuit 32 may serve both as a component mounting substrate for integrated circuits (e.g., display driver circuitry, etc.) and as a cable (e.g., a cable that extends across an housing opening such as gap 30 of FIG. 1).

Components 54 may, if desired, be mounted to both sides of flexible printed circuit 32 (e.g., both upper and lower surfaces of flexible printed circuit 32). Flexible printed circuit 32 may have an elongated outline (e.g., flexible printed circuit 32 may form an elongated strip) and/or may have a more compact (e.g., square) layout. Configurations in which flexible printed circuit 32 has a non-elongated portion and an elongated tail or tails extending outwardly from the non-elongated portion may also be used.

Figure 4:
FIG. 4 is cross-sectional side view of an illustrative flexible printed circuit with a coating such as a fluoropolymer coating in accordance with an embodiment.

The upper and/or lower surfaces of flexible printed circuit 32 may be provided with coatings to enhance the performance of flexible printed circuit 32. These coatings may, for example, improve the appearance of flexible printed circuit 32 by reducing the shininess (gloss) of flexible printed circuit 32 and/or may improve the mechanical properties of flexible printed circuit 32 (e.g., by reducing friction and therefore stickiness while increasing hydrophobicity, enhancing durability, etc.). As shown in the illustrative configuration of FIG. 4, flexible printed circuit 32 may have coatings such as layers 58 on substrate 50. In general, coatings may be formed on one or both sides of flexible printed circuit 32. In the example of FIG. 4, coating 58 has been formed on both the upper and lower surfaces of substrate 50. In other examples (see, e.g., FIGS. 5, 6, and 7) layers have been formed on one side of substrate 50.

Coating 58 of FIG. 4 may be a low-friction coating (e.g., a coating that reduces the friction and adhesion properties of flexible printed circuit 32 relative to that of substrate 50). Low friction may generally be correlated with low stickiness (low adhesion) and hydrophobicity. Accordingly, it may be desirable for coating 58 to exhibit enhanced hydrophobicity. The amount of hydrophobicity of flexible printed circuit 32 may be quantified in terms of water contact angle. As an example, substrate 50 may be characterized by a water contact angle of 81° to 95° without any coatings (i.e., substrate 50 may not be hydrophobic when uncoated). To ensure that flexible printed circuit 32 is hydrophobic (e.g., to raise the water contact angle of flexible printed circuit 32 above 100°), coating 58 may be formed on substrate 50. Coating 58 may be, for example, a fluoropolymer coating. An example of a fluoropolymer coating is perfluoropolyether. Other fluoropolymers that enhance the hydrophobicity of printed circuit 32 may be used, if desired. The resulting water contact angle of flexible printed circuit 32 of FIG. 4 when coating 58 is formed on substrate 50 may be at least 100°, at least 105°, at least 110°, or other elevated value. In general, low-friction hydrophobic coatings for printed circuit 32 such as coating 58 may be formed from oil, dry lubricants, silicone spray coatings, or any other non-stick materials.

The surface of substrate 50 may have an associated gloss value. For example, a non-matte polyimide substrate 50 may have a gloss value of 25 gloss units at 60° and a gloss value of 43 gloss units at 85° (and a water contact angle of 81°) when substrate 50 is uncoated or may have a gloss value of 10 gloss units at 60° and a gloss value of 27 units at 85° when substrate 50 is uncoated and a matte uncoated polymer substrate 50 may have a gloss value of 3 gloss units at 60° and 28 gloss units at 85° (and a water contact angle of 95°) when uncoated.

Figure 5:
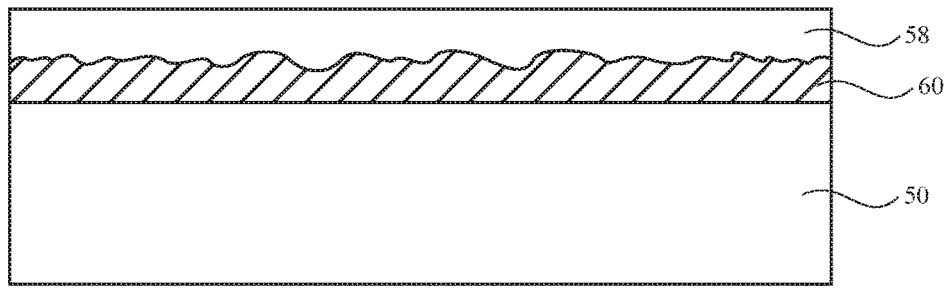
FIG. 5 is a cross-sectional side view of an illustrative flexible printed circuit with a matte coating layer and a fluoropolymer coating layer in accordance with an embodiment.

The appearance of flexible printed circuit 32 may be enhanced by reducing the shininess and brightness of flexible printed circuit 32 (e.g., by lowering the gloss value of printed circuit 32 and/or by forming a dark surface for printed circuit 32). With one illustrative configuration, a matte coating (e.g., a black matte coating) may be incorporated into flexible printed circuit 32. As shown in FIG. 5, for example, matte coating layer 60 may be formed on the surface of substrate 50 (e.g., a polyimide layer). Matte coating layer 60 may be uncovered by additional coating layers or may, as shown in FIG. 5, be coated with a low-friction coating such as fluoropolymer layer 58 to enhance hydrophobicity. Matte coating layer 60 may be formed from a polymer (e.g., epoxy, etc.) that includes light-absorbing pigment for reducing the brightness of layer 60 and that includes matting agents such as light-scattering particles that enhance the surface roughness of layer 60 and/or otherwise reducing the gloss value of flexible printed circuit 32. For example, flexible printed circuit 32 of FIG. 5 may be characterized by a gloss value of less than 18 gloss units (or less than 25 GU, less than 20 GU, or other suitable value) at 60° and may be characterized by a gloss value of less than 32 gloss units (or less than 43 GU, less than 40 GU, less than 35 GU, or other suitable value) at 85°. The color of layer 60 may be adjusted by incorporating black pigment or other colorant into layer 60 (e.g., so that layer 60 is matte black, etc.). The presence of layer 58 may help ensure that the water contact angle of flexible printed circuit 32 of FIG. 5 is at least 105° or at least 100° (as examples). The presence of matte coating layer 60 may help ensure that the appearance of flexible printed circuit 32 is not too shiny.

Figure 6:
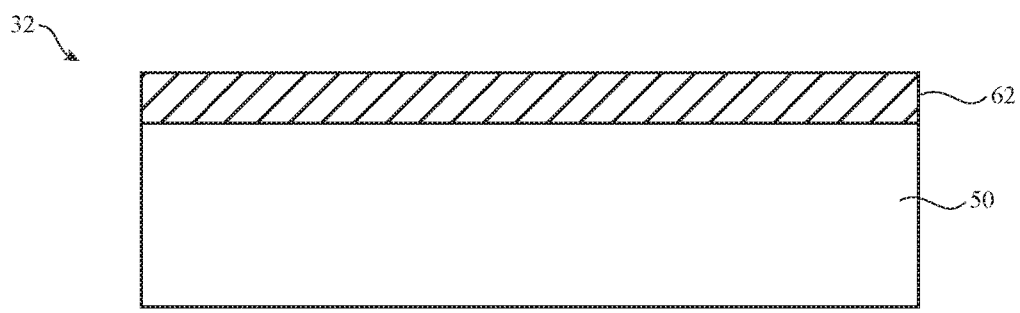
FIG. 6 is a cross-sectional side view of an illustrative flexible printed circuit with a matte fluoropolymer coating in accordance with an embodiment.
Figure 7:
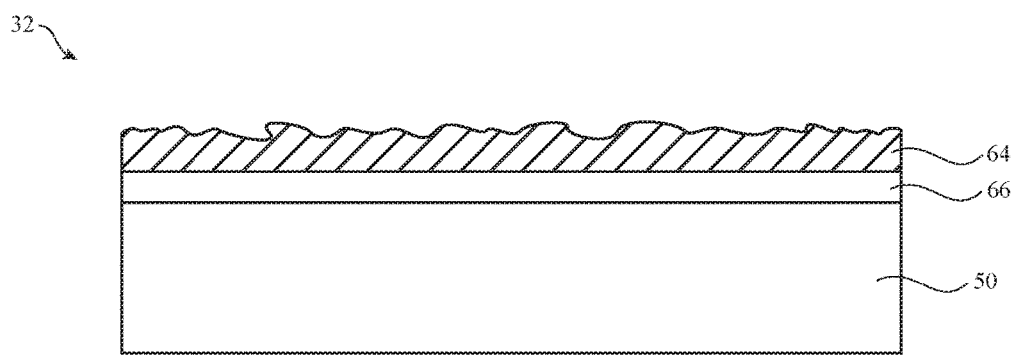
FIG. 7 is a cross-sectional side view of an illustrative flexible printed circuit to which a tape layer such as a textured black fluoropolymer tape layer has been attached using adhesive in accordance with an embodiment.

Matte coating materials and fluoropolymer materials may be combined in a single coating layer (or multiple coatings) as shown by matte fluoropolymer coating layer 62 on substrate 50 in illustrative flexible printed circuit 32 of FIG. 6. With this type of arrangement, dark pigment, matting agents, light scattering particles, and/or other materials for reducing the gloss of flexible printed circuit 32 may be combined and used in forming a fluoropolymer layer such as layer 62 on substrate 50. This may provide flexible printed circuit 32 with a gloss of 1 gloss unit (or less than 25 GU, less than 20 GU, less than 10 GU, less than 5 GU, or other suitable value) at 60° and a gloss value of 3-6 gloss units (or less than 43 GU, less than 25 GU, less than 20 GU, less than 10 GU, less than 5 GU, or other suitable value) at 85° (as an example). If desired, flexible printed circuit 32 of FIG. 6 may be textured (e.g., using the matting agents in layer 62 and/or by using a texturing drum or other equipment to impart a texture to the surface of layer 62). The texturing of layer 62 and/or the inclusion of matting agents into layer 62 may enhance hydrophobicity for flexible printed circuit 32 of FIG. 6. For example, the water contact angle of flexible printed circuit 32 of FIG. 6 may be enhanced to a value of at least 100°, at least 110°, at least 120°, at least 130°, at least 140°, or at least 150°. For at least some of these values (e.g., 150°), flexible printed circuit 32 will exhibit extreme hydrophobicity, low friction, and lack of stickiness that help prevent flexible printed circuit 32 from adhering to housing structures in device 10, etc. The ability to repel moisture from flexible printed circuit 32 may also help prevent moisture damage in device 10.

If desired, a layer of polymer may be attached to substrate 50 using adhesive. The added layer may provide enhanced robustness, hydrophobicity, opacity, low gloss, and/or other desired attributes. In the illustrative configuration of FIG. 7, a textured hydrophobic sheet (layer 64) has been attached to substrate 50 by an interposed layer of adhesive 66 (e.g., a layer of pressure sensitive adhesive or other adhesive). Layer 64 may be textured by processing the surface of layer 64 with a textured drum or using other layer texturing techniques to help enhance hydrophobicity and/or reduce gloss or, if desired, layer 64 may have an untextured surface. Layer 64 may be formed from a fluoropolymer such as polytetrafluoroethylene (as an example) to enhance hydrophobicity. Pigment may, if desired, be incorporated into layer 64 and/or matting agent may be incorporated into layer 64 to adjust the appearance of layer 64 (e.g., black pigment, matting agent to reduce the glass of layer 64, etc.). With one illustrative configuration, layer 64 and layer 66 form a tape layer (e.g., a black polytetrafluoroethylene tape layer with or without texture) and may be attached to layer 50 by lamination. The thickness of this tape layer may be 10-150 microns, more than 5 microns, less than 100 microns, or other suitable thickness. The tape layer attached to layer 50 may be formed along only part of the length of flexible printed circuit 32 (e.g., visible portions, portions that bend and/or that are visible to a user such as portion 32P of FIG. 2) and/or the tape layer may be formed over the entire surface of flexible printed circuit 32. If desired, the tape layer may be formed from a length of flexible printed circuit 32 (e.g., a printed circuit with metal traces, hydrophobic surfaces, matte surfaces, etc.).

The coating arrangements of FIGS. 4, 5, 6, 7 may be used to cover one surface or both upper and lower surfaces of flexible printed circuit 32. Moreover, polymer tape layers such as layer 64 of FIG. 7 may be formed using a single layer of a fluoropolymer (e.g., layer 58 of FIG. 4), using a matte coating such as coating 60 of FIG. 5 that is optionally coated with layer 58, using a matte fluoropolymer layer such as layer 62 of FIG. 6, using a drum-textured or other textured polymer layer (e.g., a black fluoropolymer layer such as a polytetrafluoroethylene layer or other layer that contains optional matting agent and that is optionally attached to substrate 50 with a layer of pressure sensitive adhesive or other adhesive), and/or using other suitable structures for reducing gloss, enhancing opacity (enhancing blackness and thereby reducing visibility), enhancing hydrophobicity (lowering adhesion and friction), and/or enhancing strength (robustness during bending, resistance to punctures, etc.). The configurations of FIGS. 4, 5, 6, and 7 are merely illustrative. The surfaces of flexible printed circuit 32 may be hydrophobic (e.g., the water contact angle of printed circuit 32 may be at least 100°, at least 110°, at least 130°, at least 150°, or other suitable value) and/or may exhibit low gloss (e.g., a gloss at 60° and/or 85° of less than 10 gloss units, less than 5 gloss units, less than 3 gloss units, less than 2 gloss units, less than 1 gloss unit, etc.).

The foregoing is merely illustrative and various modifications can be made to the described embodiments. The foregoing embodiments may be implemented individually or in any combination.

What is claimed is:

1. A flexible printed circuit, comprising:
a flexible polymer substrate;
metal traces embedded in the flexible polymer substrate; and
a hydrophobic layer on the flexible polymer substrate, wherein the hydrophobic layer comprises a fluoropolymer layer having a matting agent and exhibiting a gloss value of less than 2 gloss units at 60°.

2. The flexible printed circuit defined in claim 1 wherein the fluoropolymer layer is attached to the flexible polymer substrate with a layer of adhesive.

3. The flexible printed circuit defined in claim 2 wherein: the flexible polymer substrate comprises polyimide and the fluoropolymer comprises polytetrafluoroethylene.

4. The flexible printed circuit defined in claim 2 wherein the fluoropolymer layer comprises a black textured polytetrafluoroethylene layer.

5. The flexible printed circuit defined in claim 1 wherein the fluoropolymer layer has a water contact angle of at least 105°.

6. The flexible printed circuit defined in claim 5 further comprising a matte polymer layer interposed between the flexible polymer substrate and the fluoropolymer layer, wherein the fluoropolymer layer on the flexible polymer substrate with the matte polymer layer interposed between the flexible polymer substrate and the fluoropolymer layer has a gloss value of less than 20 gloss units at 60°.

7. The flexible printed circuit defined in claim 1 wherein the fluoropolymer layer is a black fluoropolymer layer having a water contact angle of at least 110°.

8. The flexible printed circuit defined in claim 7 wherein the black fluoropolymer layer includes a matting agent, wherein the black fluoropolymer layer has a gloss value of less than 2 gloss units at 60°, and wherein the black fluoropolymer layer has a water contact angle of at least 150°.

9. A portable computer, comprising:
a metal housing having an upper housing portion that contains a display and having a lower housing portion;
first and second hinges that connect the upper housing portion to the lower housing portion, wherein the upper and lower housing portions are rotatable with respect to each other;
circuitry in the lower housing portion; and
a hydrophobic flexible printed circuit that is coupled between the circuitry in the lower housing portion and the display in the upper housing portion.

10. The portable computer defined in claim 9 wherein the hydrophobic flexible printed circuit includes a polymer substrate and a hydrophobic layer on the polymer substrate.

11. The portable computer defined in claim 10 wherein the hydrophobic layer comprises a fluoropolymer coating on the polymer substrate.

12. The portable computer defined in claim 11 wherein the hydrophobic layer is characterized by a water contact angle of at least 130°.

13. The portable computer defined in claim 10 wherein the hydrophobic layer comprises a fluoropolymer layer attached to the polymer substrate by a layer of adhesive.

14. The portable computer defined in claim 13 wherein the fluoropolymer layer comprises a layer of textured black polytetrafluoroethylene.

15. The portable computer defined in claim 10 wherein the hydrophobic layer comprises a fluoropolymer layer and wherein the flexible printed circuit further comprises a matte coating layer between the polymer substrate and the fluoropolymer layer.

16. The portable computer defined in claim 10 wherein the hydrophobic layer comprises a fluoropolymer coating mixed with a matting agent and wherein the fluoropolymer coating mixed with the matting agent has a gloss value of less than 10 gloss units at 85°.

17. A flexible printed circuit, comprising:
a flexible polymer substrate containing metal traces; and
a flexible fluoropolymer coating on the flexible polymer substrate, wherein the flexible fluoropolymer coating has a water contact angle of at least 130°, wherein the flexible fluoropolymer coating comprises a matting agent, and wherein the flexible fluoropolymer coating exhibits a gloss at 60° of less than 2 gloss units.

18. The flexible printed circuit defined in claim 17 wherein the flexible fluoropolymer coating comprises a black fluoropolymer coating.

\* \* \* \* \*